(12) United States Patent
Epton et al.

(10) Patent No.: US 8,389,418 B2
(45) Date of Patent: Mar. 5, 2013

(54) SOLUTION FOR THE SELECTIVE REMOVAL OF METAL FROM ALUMINUM SUBSTRATES

(75) Inventors: Jeremy W. Epton, Surrey (GB); John Deem, Chandler, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/962,266

(22) Filed: Dec. 7, 2010

(65) Prior Publication Data

US 2011/0081785 A1 Apr. 7, 2011

Related U.S. Application Data

(62) Division of application No. 11/301,183, filed on Dec. 12, 2005, now Pat. No. 7,846,349.

(60) Provisional application No. 60/638,308, filed on Dec. 22, 2004.

(51) Int. Cl.
H01L 21/302 (2006.01)
(52) U.S. Cl. ......... 438/754; 438/745; 438/750; 216/102
(58) Field of Classification Search .................. 438/745, 438/750, 752, 753, 754; 216/100, 103, 102, 216/104
See application file for complete search history.

(56) References Cited

U.S. PATENT DOCUMENTS

| | | | |
|---|---|---|---|
| 3,642,549 A | 2/1972 | Couture et al. | |
| 4,040,897 A | 8/1977 | Blish, II et al. | |
| 4,343,677 A | 8/1982 | Kinsbron et al. | |
| 4,517,106 A | 5/1985 | Hopkins et al. | |
| 5,162,259 A | 11/1992 | Kolar et al. | |
| 6,001,215 A * | 12/1999 | Ban | 156/345.15 |
| 7,112,289 B2 | 9/2006 | Mori et al. | |
| 7,624,742 B1 | 12/2009 | Zuck | |
| 7,846,349 B2 | 12/2010 | Epton et al. | |
| 7,854,777 B2 * | 12/2010 | Takemiya et al. | 51/308 |
| 2002/0119245 A1* | 8/2002 | Verhaverbeke | 427/58 |
| 2002/0192897 A1 | 12/2002 | Molloy et al. | |
| 2003/0114014 A1 | 6/2003 | Yokoi et al. | |
| 2004/0168710 A1* | 9/2004 | Lee et al. | 134/19 |
| 2004/0171503 A1* | 9/2004 | Rovito et al. | 510/175 |
| 2005/0167393 A1 | 8/2005 | Tan et al. | |
| 2005/0245409 A1 | 11/2005 | Cernat et al. | |
| 2006/0073998 A1 | 4/2006 | Korzenski et al. | |
| 2007/0248767 A1 | 10/2007 | Okura et al. | |

FOREIGN PATENT DOCUMENTS

| | | |
|---|---|---|
| EP | 0 351 771 A1 | 1/1990 |
| JP | 11087325 A | 3/1999 |
| KR | 10-1998-0064909 A | 10/1998 |
| KR | 10-2003-0096707 A | 12/2003 |

OTHER PUBLICATIONS

European Search Report of European Patent Application No. EP 05 25 7916, date of mailing May 23, 2006.
Inoue Mayumi, Kuramasu Keizaburo and Tsutsu Hiroshi, Patent Abstracts of Japan, abstract of "Etching Solution and Manufacture of Thin-Film Transistor Using the Same".
Publication No. 11087325 A, Mar. 30, 1999, Matsushita Electric Ind Co Ltd.

* cited by examiner

*Primary Examiner* — Lah Vinh
(74) *Attorney, Agent, or Firm* — Blakely Sokoloff Taylor & Zafman LLP

(57) ABSTRACT

The present disclosure relates to a solution for selectively removing metal, such as Ta or TaN, from a substrate, such as an aluminum containing substrate. The solution comprises an acid, such as HF or buffered HF, an ingredient comprising a fluorine ion, such as ammonium fluoride ($NH_4F$), ethylene glycol, and water. A method of selectively removing metal from a substrate using this solution is also disclosed.

17 Claims, 1 Drawing Sheet

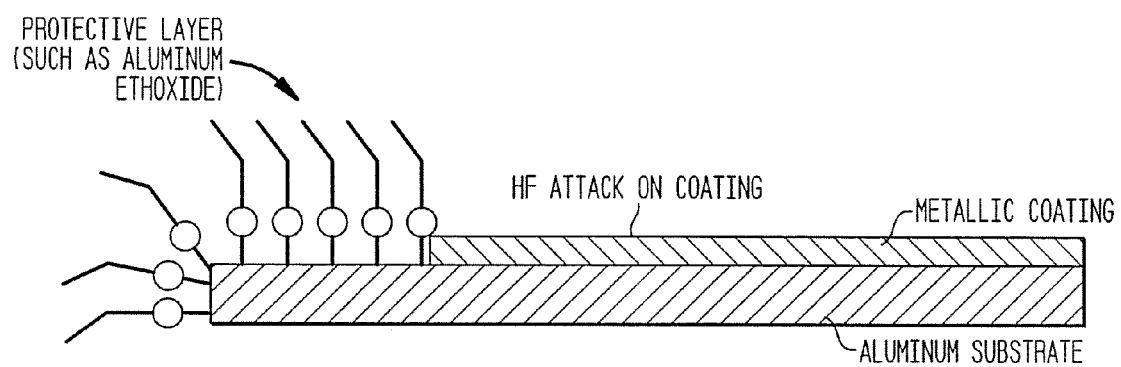

SOLUTION FOR THE SELECTIVE REMOVAL OF METAL FROM ALUMINUM SUBSTRATES

This application is a divisional of U.S. patent application Ser. No. 11/301,183, filed on Dec. 12, 2005, now U.S. Pat. No. 7,846,349 which claims the benefit of priority from U.S. Provisional Application No. 60/638,308, filed Dec. 22, 2004, the full disclosures of which are incorporated herein by reference.

The present disclosure relates to a solution for selectively removing metal, such as Ta or TaN, from a substrate, such as an aluminum containing substrate. Also disclosed is a method of selectively removing a metal coating without substantially damaging the exposed metal of the underlying substrate.

The fabrication of semiconductor devices typically comprises forming multiple layers, including a uniform photoresist coating over conductive metallic layers. Non-limiting examples of conductive metallic layers formed as diffusion barrier layers on substrates include those of aluminum titanium, tungsten, tantalum, and copper, as well as oxides, borides, nitrides, carbides, and alloys thereof. These conductive metallic films are generally formed as diffusion barriers to prevent metal in a metal layer from diffusing into an underlying dielectric layer located on the substrate. For example, a barrier layer is typically formed between a silicon containing dielectric layer (such as $SiO_2$ or $Si_3N_4$) and an Al or Cu metal layer.

Recently, tantalum (Ta) and tantalum nitride (TaN) have been found to be excellent alternatives to a traditional Ti-based diffusion barrier for use in semiconductor processing, at least in part because these materials are effective diffusion barriers up to temperatures as high as 200° C. The increased use of Ta in device manufacturing, has led to a need for process or a stripping solution to remove the Ta or TaN layer from the substrate.

For example, after performing well-known steps to obtain a microcircuit, including selective photo-etching, the removal of metals from certain areas of the microcircuit, such as a Ta or TaN layer, has typically been accomplished by organic stripping solutions.

Chemical removal of tantalum metal from an aluminum substrate is an extremely difficult process to execute. This is at least because tantalum is highly resistant to most chemical attack and requires an agent capable of donating a fluorine ion to facilitate dissolution of the Ta containing layer. Recently, methods of wet processing electronic components having tantalum containing layers thereon have been attempted with an oxidizing agent. For example, U.S. Published Patent Application No. 2002/0119245A1 describes a tantalum oxidizing solution, comprising an oxidizing agent, such as hydrogen peroxide or ozone, and a fluorine ion producing agent, such as HF or buffered HF, for wet processing electronic components.

It would be apparent to one skilled in the art that fluorine ion producing agents, such as hydrofluoric acid (HF) solutions readily attack the exposed metal, such as aluminium. Accordingly, the substrate is typically severely eroded during the process and can be damaged beyond repair.

For these reasons, alternative methods have been employed for this process such as mechanical abrasion, sometimes referred to as "Chemical Mechanical Polishing" (CMP), which removes the tantalum but also results in substrate damage, particularly when anything less than the entire substrate is covered with Ta or TaN.

Other methods of removing Ta and TaN include sputter etching. Unlike CMP, which is most useful when the entire substrate is covered with Ta or TaN, sputter etching is generally useful for a patterned etch because very specific areas can be removed in an anisotropic manner. Inherent drawbacks associated with sputtering, including the likelihood that material removed by sputtering can redeposit on exposed surfaces, have limited the use of this technique.

SUMMARY

In view of the foregoing, there is a need to remove metal from a substrate so as to possibly overcome at least part of one or more drawbacks associated with the related art. For example, some aspects of the present disclosure may relate to the selective chemical removal of metal from a substrate with minimal or no damage to the substrate.

One exemplary aspect may relate to a solution for selectively removing metal from an aluminium containing substrate. The solution may comprise: at least one acid, such as HF or buffered HF, at least one ingredient comprising a fluorine ion, such as $NH_4F$, ethylene glycol, and water. The combination of these ingredients is found in the final solution in an amount sufficient to remove metal, such as Ta, from an aluminium containing substrate.

Methods of removing metal from substrates are also disclosed. One exemplary method may be a method for selectively removing metal from a substrate comprising aluminum and being at least partially covered with a metal. For example, the method may comprise contacting the substrate with a solution comprising, in % weight of the solution, 1-20% HF, buffered HF or mixtures thereof, 1-40% $NH_4F$, 40-95% ethylene glycol, and the balance of water. In one embodiment, the solution further comprises a surfactant to aid the removal of metal from the substrate.

In the disclosed method, the solution may be contacted with the substrate for a time sufficient to remove the metal from the substrate without substantially reacting with the underlying aluminum substrate. The example may also include forming an aluminum ethoxide layer on at least one portion of exposed aluminum substrate.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWING

The accompanying drawing is incorporated in and constitutes a part of this specification.

The FIGURE is a schematic diagram of an exemplary embodiment of an aluminum substrate including one portion with a protective layer and another portion with a metallic coating to be selectively removed.

DETAILED DESCRIPTION OF EXEMPLARY EMBODIMENTS

As used herein, "selectively remove" (or derivations thereof) is intended to mean removing or stripping metal from a substrate without substantially reacting with or eroding the underlying substrate. Although in no way intending to be bound by the theory, it is believed that the highly selective removal properties associated with the disclosed solution is a function of the presence of ethylene glycol in an amount sufficient to form an ethoxide layer on at least one portion of the substrate not covered with the metal, i.e., the exposed substrate.

In certain embodiments, ethylene glycol may be used in combination with or completely substituted with other components. Non-limiting examples of such components include propylene glycol, butanediol, glycerol, or any straight, or branched chain-diol or -triol from $C_2$ to $C_6$ chain.

The FIGURE shows an example of the basic mechanism for the selective removal process described herein. In this embodiment, an organometallic layer forms on an exposed surface of an aluminium-containing substrate and protects the substrate from HF attack during a stripping process. As shown in the FIGURE, by reacting with an exposed portion of the substrate, ethylene glycol forms a protective layer (e.g., aluminium ethoxide) on the exposed portion of the substrate. This protective layer substantially prevents the substrate from being attacked by a subsequent acid treatment. For example, when the substrate comprises aluminum, the ethylene glycol is present in an amount sufficient to form an aluminum ethoxide layer on at least one portion of the substrate not covered with metal. In one embodiment, the amount of ethylene glycol sufficient to form an ethoxide layer may range from 50 to 60%, by weight of the solution.

Because it does not contain a protective ethoxide layer, the metallic coating may be susceptible to attack from an acid, such as HF. In some examples, the process described herein may lead to the selective removal of one or more metallic coatings (e.g., undesired metallic coatings), such as copper, tungsten, titanium, tantalum, as well as oxides, borides, nitrides, carbides, alloys and mixtures thereof, without substantially contacting acid with the substrate and/or etching the underlying substrate.

As used herein, "without substantial contacting . . . and/or etching" is intended to mean no detectable attack on the underlying substrate, as determined by visual inspection or weight loss measurements of the substrate.

In one embodiment, the acid component of the solution comprises a fluorine ion, such as HF or buffered HF. In another embodiment, the acid may comprise any well-known acid, such as an acid chosen from hydrochloric, sulfuric, nitric, and phosphoric acids, and mixtures thereof. Any one or any combination of these acids may be present in amount ranging from 1-20%, such as from 10-15%, by weight of the solution.

In another embodiment, the solution comprises at least one ingredient comprising a fluorine ion. Non-limiting examples of such ingredients include ammonium fluoride ($NH_4F$), sodium fluoride, potassium fluoride, ammonium bifluoride, sodium bifluoride, ammonium fluroborate, and barium fluoride. Any one or any combination of these ingredients may be present in amount ranging from 1-40%, such as from 5-20%, and even 5-15%, by weight of the solution.

The solution described herein may optionally comprise additives generally used in stripping solutions. For example, the solution may comprise one or more additives chosen from surfactants, anti-corrosion agents, pH modifiers, and the like. In one embodiment, these optional ingredients may be present in an amount up to 5% by weight of the solution. Non-limiting examples of surfactants that can be optionally incorporated into the disclosed solution include both straight chain and branched primary, secondary and tertiary amines of chain length $C_2$ to $C_{12}$, amides, fluorocarbons and alkylethoxylates, including anionic, nonionic, cationic and amphoteric surfactants, and mixtures thereof. Examples of such surfactants can be found in Published U.S. Patent Application Nos. US 2002/0119245 A1, published Aug. 29, 2002, and US 2003/0114014A1, published Jun. 19, 2003, which are herein incorporated by reference. In one embodiment, the surfactant is octylamine ($C_8$). Other surfactants that may be used include fluorocarbon surfactants, such as the FC range from 3M®, amides and alkyl ethoxylates.

Examples of the anti-corrosion agent include benzotriazole and pyrocatechol.

Non-limiting examples of pH modifiers that may be used to maintain a pH of the solution of less than 7, such as less than 6, even less than 5, and less than 4, include any suitable acid, such as an acid chosen from hydrochloric, sulfuric, acetic, and phosphoric acids, and mixtures thereof.

In one embodiment, there is disclosed a solution for selectively removing Ta or TaN from an aluminium-containing substrate, wherein the solution comprises, in weight % of the solution: 1-20% HF, 1-40% $NH_4F$, 40-95% ethylene glycol, and optionally a surfactant, with the balance comprising water.

Also disclosed herein is a method for selectively removing metal from a substrate using any of the previously described solutions. For example, the method comprises contacting the substrate with the previously described solution (e.g., a solution comprising at least one acid, at least one ingredient comprising a fluorine ion, ethylene glycol, and water), wherein the substrate is contacted with the solution for a time sufficient to remove metal from the substrate with substantially no substrate erosion.

For example, there is disclosed a method for selectively removing metal from a substrate comprising aluminum and being at least partially covered with a metal. In this example, the method may comprise contacting the substrate with a solution comprising, in % weight of the solution, 1-20%, such as 10-15% HF, 1-40%, such as 10-15% $NH_4F$, 40-95%, such as 50-60% ethylene glycol, and the balance of water.

According to some exemplary processes, the substrate may be contacted with the solution for a time sufficient to remove metal from the substrate without substantially reacting with the substrate, wherein an aluminum ethoxide layer is formed on at least one portion of exposed substrate.

The contact time sufficient to remove metal from the substrate may be dependent on various factors, including the thickness of the metal layer to be removed, the concentration and amount of the ingredients present, such as the acid, the ingredient comprising a fluorine ion, ethylene glycol and the water. Other factors that may affect the contact time include the pH of the solution, and temperature at which the solution is contacted to the substrate. Generally, the etching rate may decrease with increased pH. Thus, the contact time may increase with increase pH of the solution.

The etch rate may also be a function of the solution temperature, the etch rate generally increasing with increasing temperature. The method described herein may be performed with the solution heated up to 120° F., wherein the maximum temperature allowable may depend on the selectivity of the given system. For example, in one embodiment, in which Ta/TaN is removed from an Al containing substrate, the solution is heated to a temperature ranging from 85° C. to 95° C. In another embodiment, the solution is heated to a temperature ranging from room temperature up to 85° C.

The above-described method may be carried out using any well-known wet processing procedure. For example, contacting the metal coated substrate with the described solution may take place using a batch-type procedure, for example, by immersing the substrate in a bath containing the solution for a period of time sufficient to remove the metal.

Alternatively, contacting the substrate may be carried out using a continuous procedure. In this embodiment, one or more substrates may be passed through a vessel containing the solution at a rate that will remove metal.

Either one or both of these types of processes may occur in a single or multi-step processes. In addition, a process comprising a mixture of a continuous and batch style may be used.

Regardless of the exact process used, the mechanism may be generally the same. For example, the processing solution may contain a complexing agent in quantities sufficient to react with the substrate surface as soon as the coating is removed, i.e., to expose the substrate. This organic-metallic complex may be non-soluble in the stripping medium, which allows it to protect the substrate from attack, but may be subsequently removed during further processing. For example, the aluminum ethoxide complex may be soluble in water and may be removed with a rinse following the acidic removal of the coating.

In one embodiment, the process comprises exposing the substrate to a timed immersion in a wet chemical bath or a spray from a chemical spray tool until the metal becomes completely removed. Such a process can be multi-step in so far as there may be a cycle of strip-inspect-strip-inspect until removal is complete. While a continuous system is generally rare in the semiconductor industry, it could be operated as described herein once the strip time is established for a particular set of components.

Other than in the operating examples, or where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the foregoing specification and following claims are approximations that may vary depending upon the desired properties sought to be obtained. At the very least, and not as an attempt to limit the application of the doctrine of equivalents to the scope of the claims, each numerical parameter should be construed in light of the number of significant digits and ordinary rounding approaches.

It will be apparent to those skilled in the art that various modifications and variations can be made to the subject matter described herein. Thus, it should be understood that the invention is not limited to the discussion set forth in the specification. Rather, the present invention is intended to cover modifications and variations.

What is claimed:

1. A method comprising:
   contacting an aluminum-containing substrate with a solution to selectively remove a metal containing coating from the aluminum-containing substrate, the solution comprising in weight % of the solution:
   1-20% of at least one acid selected from the group consisting of hydrofluoric acid (HF), hydrochloric acid, sulfuric acid, nitric acid, phosphoric acid, and mixtures thereof,
   1-10% of at least one ingredient comprising a fluorine ion, wherein the ingredient is selected from the group consisting of ammonium fluoride ($NH_4F$), potassium fluoride, sodium fluoride, and mixtures thereof,
   50-60% ethylene glycol, and
   water,
   forming an aluminum ethoxide layer on an exposed portion of the substrate that is not covered by the coating;
   wherein said substrate is contacted with the solution for a time sufficient to remove the coating from the substrate with substantially no substrate erosion.

2. The method of claim 1, wherein the substrate comprises a material selected form the group consisting of elemental aluminum, aluminum nitride, aluminum boride and mixtures thereof.

3. The method of claim 1, wherein the at least one ingredient comprising a fluorine ion is ammonium fluoride ($NH_4F$).

4. The method of claim 1, wherein said solution further comprises at least one anionic, non ionic, cationic, or amphoteric surfactant.

5. The method of claim 4, wherein the at least one surfactant is selected from the group consisting of primary amines of chain length $C_2$ to $C_{12}$, secondary amines of chain length $C_2$ to $C_{12}$ tertiary amines of chain length $C_2$ to $C_{12}$, amides, fluorocarbons and alkylethoxylates.

6. The method of claim 1, wherein said solution has a pH of less than 6.

7. The method of claim 1, wherein the metal containing coating comprises a metal or metal compound selected from the group consisting of copper, tungsten, titanium, tantalum, and oxides, borides, nitrides, carbides, alloys and mixtures thereof.

8. The method of claim 7, wherein the metal containing coating comprises a material selected from the group consisting of metallic tantalum and tantalum nitride.

9. The method of claim 1, wherein the at least one acid is HF.

10. The method of claim 9, wherein the at least one ingredient comprising a fluorine ion is present in amount ranging from 1-5%, by weight, of the solution.

11. The method of claim 1, wherein the solution is heated to a temperature up to 120° C.

12. The method of claim 11, wherein the solution is heated to a temperature ranging from 85° C. to 95° C.

13. The method of claim 12, wherein the solution is heated to a temperature ranging from room temperature up to 85° C.

14. A method for selectively removing metal from a substrate comprising aluminum and being at least partially covered with a metal selected from the group consisting of Ta and TaN, said method comprising:
    contacting the substrate with a solution comprising, in % weight of the solution,
    1-20% HF, buffered HF or mixtures thereof,
    1-15% $NH_4F$,
    40-95% ethylene glycol, and
    the balance of water,
    forming an aluminum ethoxide layer on at least one portion of exposed aluminum substrate,
    wherein the substrate is contacted with the solution for a time sufficient to remove Ta or TaN from the substrate with substantially no substrate erosion, wherein said solution is heated to a temperature ranging from 85 to 95° F. prior to or during contact with the substrate.

15. The method of claim 14, wherein the solution comprises 1-10% of the $NH_4F$, in wt % of the solution.

16. The method of claim 15, wherein the solution comprises 50-60% of the ethylene glycol, in wt % of the solution.

17. The method of claim 15, wherein the solution comprises 1-5% of the $NH_4F$, in wt % of the solution.

* * * * *